United States Patent [19]
Chalco et al.

[11] Patent Number: 5,298,715
[45] Date of Patent: Mar. 29, 1994

[54] LASERSONIC SOLDERING OF FINE INSULATED WIRES TO HEAT-SENSITIVE SUBSTRATES

[75] Inventors: Pedro A. Chalco, Yorktown Heights, N.Y.; Wesley L. Hillman, Morgan Hill, Calif.; Richard H. Kurth, Palo Alto, Calif.; Nicholas T. Panousis, San Jose, Calif.

[73] Assignee: International Business Machines Corporation, Armonk, N.Y.

[21] Appl. No.: 874,666

[22] Filed: Apr. 27, 1992

[51] Int. Cl.⁵ .............................................. B23K 26/00
[52] U.S. Cl. ............................ 219/121.64; 219/85.13
[58] Field of Search .................... 219/121.63, 121.64, 219/85.12, 85.13

[56] References Cited

U.S. PATENT DOCUMENTS

| | | | |
|---|---|---|---|
| 3,463,898 | 8/1969 | Takaoka et al. | 219/121.63 |
| 3,789,183 | 1/1974 | Conley | 219/92 |
| 4,330,699 | 5/1982 | Farrow | 219/121 LD |
| 4,534,811 | 8/1985 | Ainslie et al. | 219/121.63 X |
| 4,597,520 | 7/1986 | Biggs | 228/111 |
| 4,712,723 | 12/1987 | Moll et al. | 228/111 |
| 4,818,322 | 4/1989 | Morino et al. | 156/272.8 |
| 4,866,573 | 9/1989 | Bernstein | 361/400 |
| 4,893,742 | 1/1990 | Bullock | 228/110 |
| 4,955,523 | 9/1990 | Carlomagno et al. | 228/179 |
| 4,970,365 | 11/1990 | Chalco | 219/121.63 |

OTHER PUBLICATIONS

"Solder Cream Laser-Assisted Ultrasonic Reflow Solder Application Method Research Disclosure 31919", No. 319, Kenneth Mason Publications, Ltd., England Nov. 1990.

IBM Technical Disclosure Bulletin, "Bonding Conductors To Microelectronic Devices and Packages", vol. 27, No. 12 5185, pp. 7005-7008.

*Primary Examiner*—C. L. Albritton
*Attorney, Agent, or Firm*—Philip J. Feig; Stephen C. Kaufman

[57] ABSTRACT

A combination of laser energy and ultrasonic energy is used for soldering an insulated wire to a pad located on a substrate. The combined laser energy and ultrasonic energy strips the insulation from the wire and solders the resulting bare wire to the pad. The method has particular use for soldering insulated wire to pads located on heat sensitive substrates or to pads located in close proximity to heat sensitive devices. A principal application is for soldering fine insulated wires for connecting a thin film magnetic head to a circuit carrier substrate.

14 Claims, 2 Drawing Sheets

LASERSONIC SOLDERING OF FINE INSULATED WIRES TO HEAT-SENSITIVE SUBSTRATES

BACKGROUND OF THE INVENTION

The present invention relates to the use of a combination of laser energy and ultrasonic energy for soldering an insulation coated wire to a solder covered pad located on a heat-sensitive substrate, and particularly to the stripping and soldering of fine insulated wires for connecting a magnetic head to a circuit carrier substrate.

Packaging of magnetic heads requires very delicate wire connecting operations in order to interconnect the magnetic head component to a circuit carrier for providing electrical signals to and receiving electrical signals from the magnetic head.

Presently, insulation is removed from insulated wire by conventional wire stripping methods, such as plasma or laser stripping. The bare wire is subsequently soldered or otherwise jointed to a metallic pad located on the magnetic head. While this process is generally successful, future developments and product demands will require improved manufacturing methods. For example, the constant industry migration toward higher storage densities requires the use of very fine wires and smaller pad dimensions. All the while, there is constant demand for improving manufacturability and reducing costs.

It is doubtful that existing ultrasonic bonding and thermode-reflow techniques currently in use will meet future joining requirements. While wire-soldering itself is a well established technology, conventional methods require the steps of removing any insulation from the wire, applying flux to the bare wire and then applying high intensity heat pulses for a relatively long-time duration. The combination of steps described are detrimental to delicate electrical assemblies which are sensitive to heat and corrosion damage. Furthermore, experience with electrical thermodes indicates that some heat is applied indirectly to the wire through melting of the solder and there is occasional solder splattering and solder bridging short circuits. Another problem with conventional solder heating is solder embrittlement at the bonding interface due to the relatively long heat exposure time of several seconds during soldering.

The prior art contains proposed solutions to these problems. For example, U.S. Pat. No. 4,893,742 issued to P. Bullock describes fluxless soldering of a wire to a pad by the combined application of ultrasonic energy and laser energy. The patent describes the joining of a bare lead to a pad.

U.S. Pat. No. 4,818,322 issued to R. Morino et al describes the use of laser energy for bonding and stripping conductors during a scribing operation. Laser energy is used to achieve insulation stripping, soldering and cutting of conductors at terminal points. Ultrasonic energy is supplied to provide a relatively small frictionless wire guide and to press the wire into an activated adhesive. The ultrasonic energy does not contribute significantly to the energy supplied for activating the adhesive.

U.S. Pat. No. 3,789,183 issued to L. Conley describes the application of ultrasonic vibrations to scrub away the insulation from a wire prior to applying a welding current to weld the wire to a terminal.

The present invention provides a solution to the problem of fluxless soldering of insulated wires to pads without heat damage exposure of delicate electrical devices located near the bonding pad and to the substrate supporting the pad. A bonding or soldering tip is ultrasonically vibrated while the tip is being heated with laser energy to remove the insulation from a wire and then melt solder in order to join the wire to a pad located on a substrate without the addition of any flux. The laser energy is highly localized and of a sufficiently low-energy to avoid heat damage to either electrical devices or the substrate.

SUMMARY OF THE INVENTION

In accordance with the teachings of the present invention an insulated wire is positioned over a solder covered pad located on a substrate. An ultrasonic resonator terminating in a fine tip is aligned with the wire. An optical fiber is connected to the resonator for providing laser energy to the tip with sufficient energy to heat the tip and remove the insulation from the wire.

A force is applied to the resonator and hence the tip for urging the wire into forced intimate contact with the pad. The tip is made to undergo reciprocating translating motion at an ultrasonic frequency while pulsed laser energy is applied to the tip. The combination of ultrasonic energy and laser energy is sufficient to melt or evaporate any wire insulation and to melt the solder on the pad. The frontal surface of the tip may contain a cavity for forming a fillet in the solder under the wire. The ultrasonic and laser energy ceases and after the solder begins to solidify, the tip is removed from solder joint. The solder solidifies forming a permanent joint between the previously insulated wire and the solder pad without the use of flux and without a separate step of stripping the insulation from the wire.

A principal object of the present invention is therefore, the provision of a method of applying a combination of ultrasonic energy and laser energy for the soldering of an insulated wire to a pad located on a substrate.

Another object of the invention is the provision of a method of applying ultrasonic energy and laser energy to remove insulation from a wire and join the resulting bare wire to a solder pad without any flux.

A further object of the invention is the provision of a method for using a combination of ultrasonic energy and laser energy in the fabrication of magnetic head assemblies.

Further and still other objects of the invention will become more clearly apparent when the following description is read in conjunction with the accompanying drawing.

DETAILED DESCRIPTION

Figure 1:
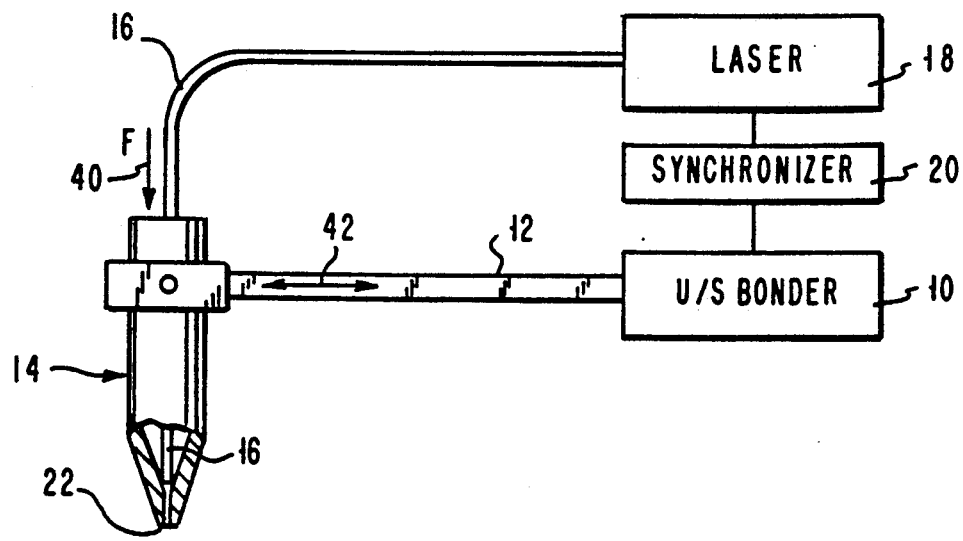
FIG. 1 is a schematic diagram of a preferred embodiment of an apparatus useful for practicing the present invention.

Referring now to the figures and to FIG. 1 in particular, there is shown a schematic diagram (not to scale) of a preferred embodiment of an apparatus useful for practicing the present invention.

A preferred apparatus for applying a combination of ultrasonic energy and laser energy to a workpiece is described in U.S. Pat. No. 4,970,365, issued to P. Chalco and assigned to the same assignee as the present invention, which patent is incorporated herein by reference.

An ultrasonic welding or bonding apparatus 10 is coupled to a horn or resonator 12 for coupling reciprocating vibratory motion from the bonder 10 to a bonding tip 14. Also coupled to the tip 14 via an optical fiber 16 is a laser 18 for heating the end of the tip. A synchronizer 20 is coupled to the laser 18 and to the ultrasonic bonder 10 for controlling the sequence, timing and operation of the several apparatus.

Figure 2:
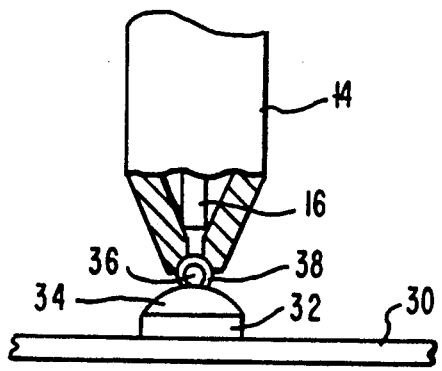
FIG. 2 is an exploded view, partially in cross section, of a bonding tip contacting an insulated wire to be soldered to a pad located on a substrate.
Figure 3A:
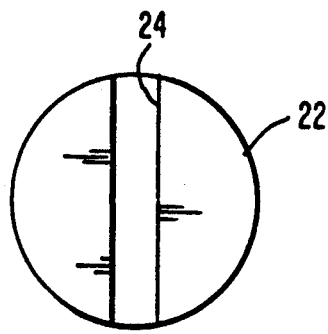
FIGS. 3A and 3B are bottom end views of alternative preferred embodiments of frontal surfaces of a bonding tip.
Figure 3B:
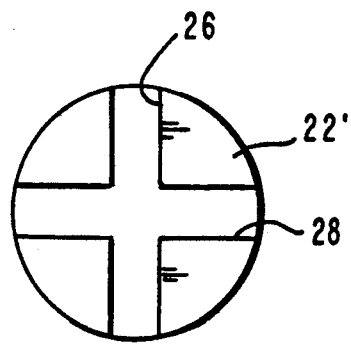

As best shown in FIGS. 2, 3A and 3B, in a first embodiment of the invention the frontal surface 22 of the tip 14 contains either a single groove 24 or cross-grooves 26 and 28 for containing the wire as will be described below. In an alternative embodiment, the frontal surface 22 is flat, without any groove.

A substrate or structure 30, such as a printed circuit board or magnetic head, having a bonding pad 32 covered with solder 34 to which a wire 36 coated with a layer of insulation 38 is to be joined is located on an anvil (not shown) disposed opposite the frontal surface 22 of the tip 14.

The frontal surface 22 of the tip 14 is shaped to capture and hold the wire and to mold the solder fillet into a predetermined shape. The groove is dimensioned to securely hold the wire during the soldering process. The cross groove is dimensioned to both securely hold the wire and form a fillet of a corresponding configuration in the solder. The tip is preferably fabricated from tungsten or tungsten alloys for long wear but other suitable material which resist wear, oxidation and solder wetting, such as aluminum and its alloys, are also useable for fabrication of the tip.

The method of soldering the wire 36 to the pad 32 commences with the insulated wire being positioned over the pad as shown in FIG. 2. The bonding tip 14 is positioned with respect to the wire such that the wire is securely held in place with groove 24, 26 or 28 in the respective tip frontal surface 22 or 22'.

A force is applied by an actuator, not shown, in the direction of arrow 40, normal to the longitudinal axis of the wire 36, urging the wire 36 covered with insulation layer 38 into intimate contact with the solder covered pad 32. Synchronizer 20 causes resonator 12 to undergo reciprocating vibratory motion at an ultrasonic frequency in the range between 10 khz and 100 khz in the direction of double headed arrow 42 for causing the tip 14 to undergo reciprocating vibratory motion in a direction parallel to the longitudinal axis of the wire 36. The tip undergoes a peak-to-peak motion in the range of 0.1 $\mu$m to 10 $\mu$m. Synchronizer 20 also causes laser 18 to transmit laser energy along optical fiber 16 into the tip 14.

A preferred laser is a Nd:YAG laser. However, other types of lasers, such as Argon-Ion or a diode laser may also be used for providing the requisite laser energy. The laser energy is applied as pulses of energy in the range between 1 watt and 50 watts. The pulse duration is in the range between 5 msec and 500 msec depending upon the power level.

When a bonding tip 14 having a flat, non-grooved, frontal surface is used, the force F in the direction of arrow 40 is sufficient to maintain the frontal surface in intimate contact with the wire 36 for applying ultrasonic energy and laser energy.

The timing and sequencing of the applied ultrasonic energy and laser energy is controlled by the synchronizer 20. Either the ultrasonic energy or the laser energy can commence before the other or the energies can be made to commence simultaneously. Both the ultrasonic energy and laser energy are applied concurrently for a predetermined period of time and then the energies cease either one at a time, or simultaneously, depending upon the wire and insulation materials involved in the particular application.

A sufficient quantity of laser energy is provided to the frontal region of the tip 14 to heat the tip and remove the insulation layer 38 from around the wire 16. The melting temperature of typical insulation material, such as polyester is close to the melting temperature of eutectic Sn-Pb solder. After the insulation layer melts, the frontal surface 22 of the tip 14 directly contacts the bare wire 36, rapidly heating the wire and causing the solder 34 to melt. The strong wire-wetting force of the solder maintains the insulation out of the soldering area. The result is a process of soldering through insulation.

Concurrently with the application of the laser energy, ultrasonic energy is provided for scrubbing the bare wire thereby preventing the formation of an oxide layer before and while the solder is wetting the bare wire.

After a predetermined period of time when the insulation layer is removed and the solder is in a melted or molten state, the laser energy and ultrasonic energy ceases. Upon solidification of the solder, the force F is removed and the tip is removed from the wire 36 which is then soldered to pad 32.

In a preferred embodiment, low-level energy pulses in the range of approximately 10 to 30 watts of between 100 and 400 msec duration, very precisely controlled, was applied to the tip 14 thus eliminating exposure of critical electrical components on the substrate 10 from thermal damage.

Solder splattering defects are totally eliminated since the wire is heated directly through the tip causing a smaller solder melting wave originating at the wire and emanating away from the wire. Solder joint embrittlement is also avoided by reducing the heat exposure time of the solder interface with the copper wire and gold covered pad to well below one second.

While heat alone has been found to remove the insulation layer and melt the solder, it has been discovered that the concurrent application of ultrasonic energy during the soldering process provides for a more controllable process window and a resultant more consistent soldering process.

While the bonding tip 14 shown in the figures and the bonding tip described and illustrated in U.S. Pat. No. 4,970,365 refer to a tip having an open cavity at the frontal surface, the present invention may be practiced using a bonding tip having a closed frontal surface, i.e. without a cavity and either with or without any groove.

Figure 4:
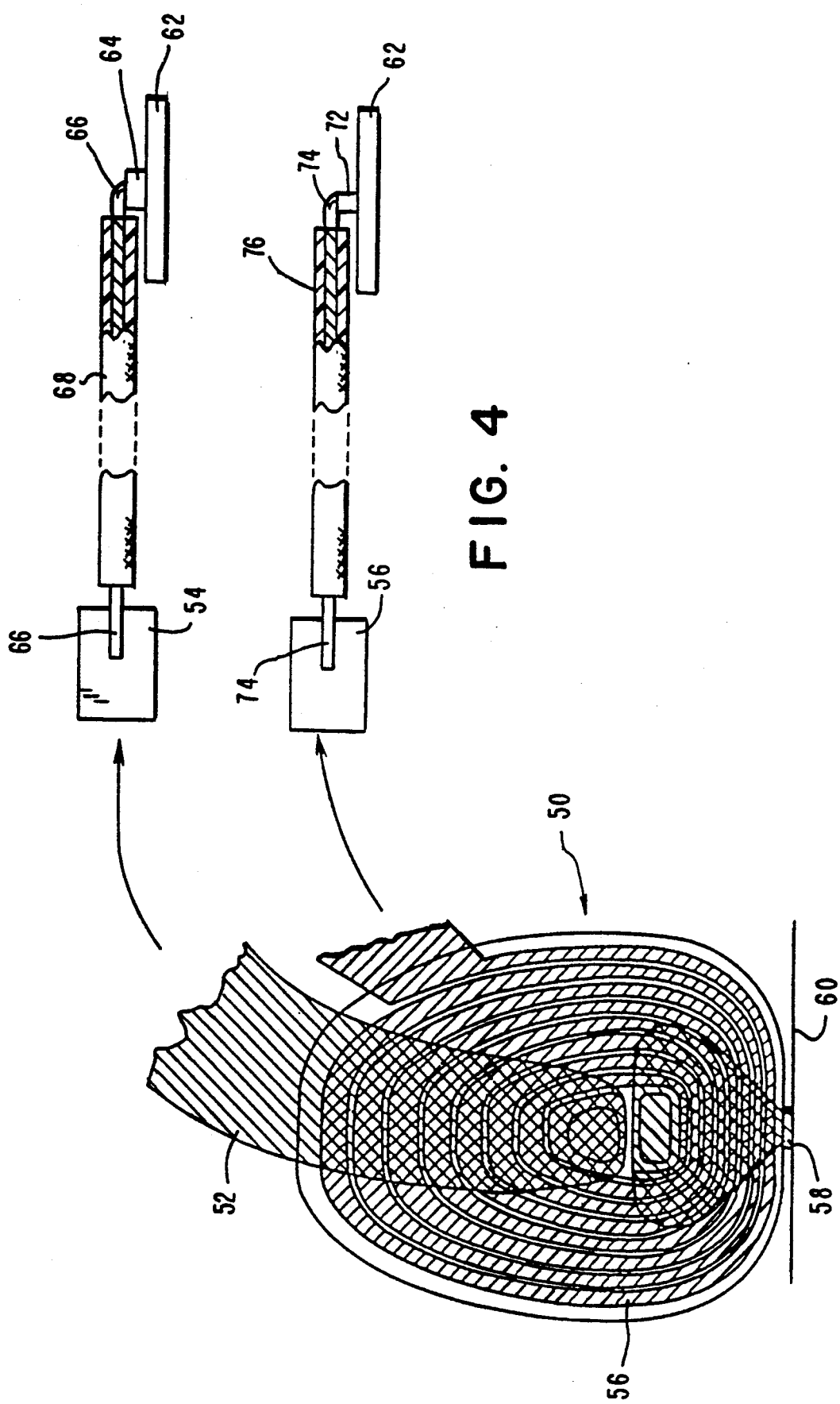
FIG. 4 is a schematic planar view of the thin film magnetic head connected to a circuit carrier substrate.

The invention is particularly advantageous for joining wires to solder pads located on temperature sensitive thin film magnetic head devices as shown in FIG. 4.

The thin film magnetic head 50 includes magnetic layer 52 which terminates in a solder coated pad 54 on a substrate not shown. A plurality of concentric conductor turns 56 terminates in a solder coated pad 56 on the substrate (not shown). The pole tip 58 is shown disposed opposite an air-bearing surface 60.

A circuit carrier substrate 62 containing an electric circuit and having a pad 64 is connected via wire 66 covered with a layer of insulation 68 to the pad 54. The solder connection between wire 66 and pad 54 is performed in accordance with the method described above. Similarly, another pad 72 located on substrate 62 is connected via wire 74 covered with a layer of insulation 76 to the pad 56. The solder connection between wire 74 and pad 54 is also performed in accordance with the method described above.

In the fabrication of solder connections of insulated wires to pads 54 and 56 which are in close proximity to the thermally sensitive thin film magnetic head 50, it is important that heat generated during the combined insulation stripping and soldering operation does not adversely affect the magnetic head.

When practicing the present invention, thin film magnetic head device have undergone a temperature increase well below the temperature rise considered permissible when fabricating such devices. The result was the absence of heat damage of sensitive devices located in proximity to the bonding pads.

While there has been described and illustrated a preferred method of soldering an insulated wire to a bonding pad by means of the concurrent application of ultrasonic energy and laser energy, it will be apparent to those skilled in the art that modifications and variations are possible without deviating from the broad spirit and principle of the present invention which shall be limited solely by the scope of the claims appended hereto.

What is claimed is:

1. A method of soldering an insulated wire to a pad comprising the steps of:
   disposing a wire having a longitudinal axis and surrounded by a layer of insulation in juxtaposition with a solder covered pad;
   contacting the insulation with a bonding tip;
   applying a force to the tip in a direction along an axis substantially normal to the longitudinal axis of the wire urging the wire into forced intimate contact with the solder covered pad;
   applying laser energy for heating the tip;
   applying ultrasonic energy to the tip for causing the tip to undergo reciprocating vibratory motion in a direction along an axis substantially parallel to the longitudinal axis of the wire while the tip is in forced contact with the wire; and
   ceasing said applying a force, said applying laser energy and said applying ultrasonic energy after a predetermined period of time when the insulation is melted away from the wire by action of the combined heating and vibratory steps; whereby, the solder melts and strips the insulation off the wire.

2. A method of soldering as set forth in claim 1, wherein the bonding tip has a frontal surface containing a groove for holding the wire.

3. A method of soldering as set forth in claim 1, wherein the bonding tip has a frontal surface containing a cross-groove for holding the wire and forming a solder fillet.

4. A method of soldering as set forth in claim 1, wherein the bonding tip has a flat frontal surface.

5. A method of soldering as set forth in claim 1, wherein said applying laser energy to the tip removes the layer of insulation from the wire prior to said applying ultrasonic energy.

6. A method of soldering as set forth in claim 1, wherein said applying a force, said applying laser energy and said applying ultrasonic energy occurs concurrently.

7. A method of soldering as set forth in claim 1, wherein the pad is located on a heat sensitive substrate.

8. A method of soldering as set forth in claim 1, wherein the pad is located in proximity to a heat sensitive device.

9. A method of soldering insulated wire for connecting a magnetic head to a circuit carrier substrate comprising the steps of:
   disposing an insulated wire having a longitudinal axis in juxtaposition with a solder covered pad in proximity to said magnetic head;
   contacting the insulated wire with a bonding tip;
   applying a force to the tip in a direction along an axis substantially normal to the longitudinal axis of the insulated wire urging the insulated wire into forced intimate contact with the solder covered pad;
   applying laser energy to the tip sufficient to heat the tip;
   applying ultrasonic energy to the tip for causing the tip to undergo reciprocating vibratory motion in a direction along an axis substantially parallel to the longitudinal axis of the wire while in contact with the wire; and
   ceasing said applying a force, said applying laser energy and said applying ultrasonic energy after a predetermined period of time when insulation is removed from the wire and the wire is soldered to the pad.

10. A magnetic head connected via an insulated wire to a circuit carrier substrate wherein the wire is connected to the head in accordance with the method set forth in claim 9.

11. A method of soldering insulated wire for connecting a magnetic head to a circuit carrier substrate as set forth in claim 9 wherein the bonding tip has a frontal surface containing at least one groove for holding the wire.

12. A method of soldering insulated wire for connecting a magnetic head to a circuit carrier substrate as set forth in claim 9 wherein the bonding tip has a flat frontal surface.

13. A method of soldering an insulated wire for connecting a magnetic head to a circuit carrier substrate as set forth in claim 9 wherein said applying laser energy to the tip removes insulation from the wire.

14. A method of soldering an insulated wire for connecting a magnetic head to a circuit carrier substrate as set forth in claim 9 wherein said applying laser energy and said applying ultrasonic energy occurs concurrently.

* * * * *